US011869934B2

(12) United States Patent
Lin et al.

(10) Patent No.: US 11,869,934 B2
(45) Date of Patent: Jan. 9, 2024

(54) ULTRA-HIGH VOLTAGE RESISTOR WITH VOLTAGE SENSE

(71) Applicant: Silanna Asia Pte Ltd, Singapore (SG)

(72) Inventors: Wen Cheng Lin, San Diego, CA (US); Ren Huei Tzeng, San Diego, CA (US); Shanghui Larry Tu, San Diego, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 17/443,967

(22) Filed: Jul. 29, 2021

(65) Prior Publication Data

US 2022/0045163 A1    Feb. 10, 2022

Related U.S. Application Data

(60) Provisional application No. 63/063,746, filed on Aug. 10, 2020.

(51) Int. Cl.
*H01L 29/06* (2006.01)
*H01L 29/43* (2006.01)
*H01L 29/78* (2006.01)

(52) U.S. Cl.
CPC ........ *H01L 29/0649* (2013.01); *H01L 29/435* (2013.01); *H01L 29/7816* (2013.01)

(58) Field of Classification Search
CPC ......... H01L 29/06; H01L 29/43; H01L 29/66; H01L 29/78; H01L 29/435; H01L 29/0623; H01L 29/0649; H01L 29/0653; H01L 29/0692; H01L 29/7816; H01L 29/0634; H01L 29/7835; H01L 29/66659; H01L 27/06; H01L 23/528; H01L 21/74; H01L 21/265; H01L 21/762; H01L 21/26513; H01L 21/76202; H01L 29/45; H01L 29/94; H01L 29/456; H01L 29/732; H01L 29/868; H01L 29/0676
USPC .......................................................... 257/401
See application file for complete search history.

(56) References Cited

U.S. PATENT DOCUMENTS

| 8,624,322 | B1 | 1/2014 | Su et al. |
| 2007/0040221 | A1 | 2/2007 | Gossner et al. |
| 2008/0117653 | A1 | 5/2008 | Saito |
| 2009/0323376 | A1* | 12/2009 | Saito ................. H02M 3/33523 257/379 |

(Continued)

OTHER PUBLICATIONS

International Search Report and Written Opinion dated Nov. 4, 2021 for PCT Patent Application No. PCT/IB2021/056930.

*Primary Examiner* — Chuong A Luu
(74) *Attorney, Agent, or Firm* — MLO, a professional corp.

(57) ABSTRACT

A semiconductor device includes an active region, a LOCOS region formed within the active region and that extends vertically above a top surface of the active region, a gate region formed above the top surface of the active region, and a polysilicon resistor having a bottom surface that is offset vertically and physically isolated from a top surface of the LOCOS region. The active region includes a source region laterally disposed from the gate region, a drain region laterally disposed from the gate region, and a drift region laterally disposed between the gate region and the drain region. The polysilicon resistor is formed above the drift region. The active region further includes a first charge balance region formed in the active region below the drift region.

12 Claims, 10 Drawing Sheets

(56) References Cited

U.S. PATENT DOCUMENTS

| | | | |
|---|---|---|---|
| 2012/0175749 A1* | 7/2012 | Haensch | H01L 21/845 |
| | | | 257/E21.135 |
| 2012/0280361 A1 | 11/2012 | Su et al. | |
| 2013/0032862 A1 | 2/2013 | Su et al. | |
| 2013/0161740 A1 | 6/2013 | Disney et al. | |
| 2018/0350799 A1 | 12/2018 | Ho et al. | |
| 2019/0006460 A1 | 1/2019 | Chiu et al. | |
| 2020/0013890 A1* | 1/2020 | Edwards | H01L 29/1095 |

\* cited by examiner

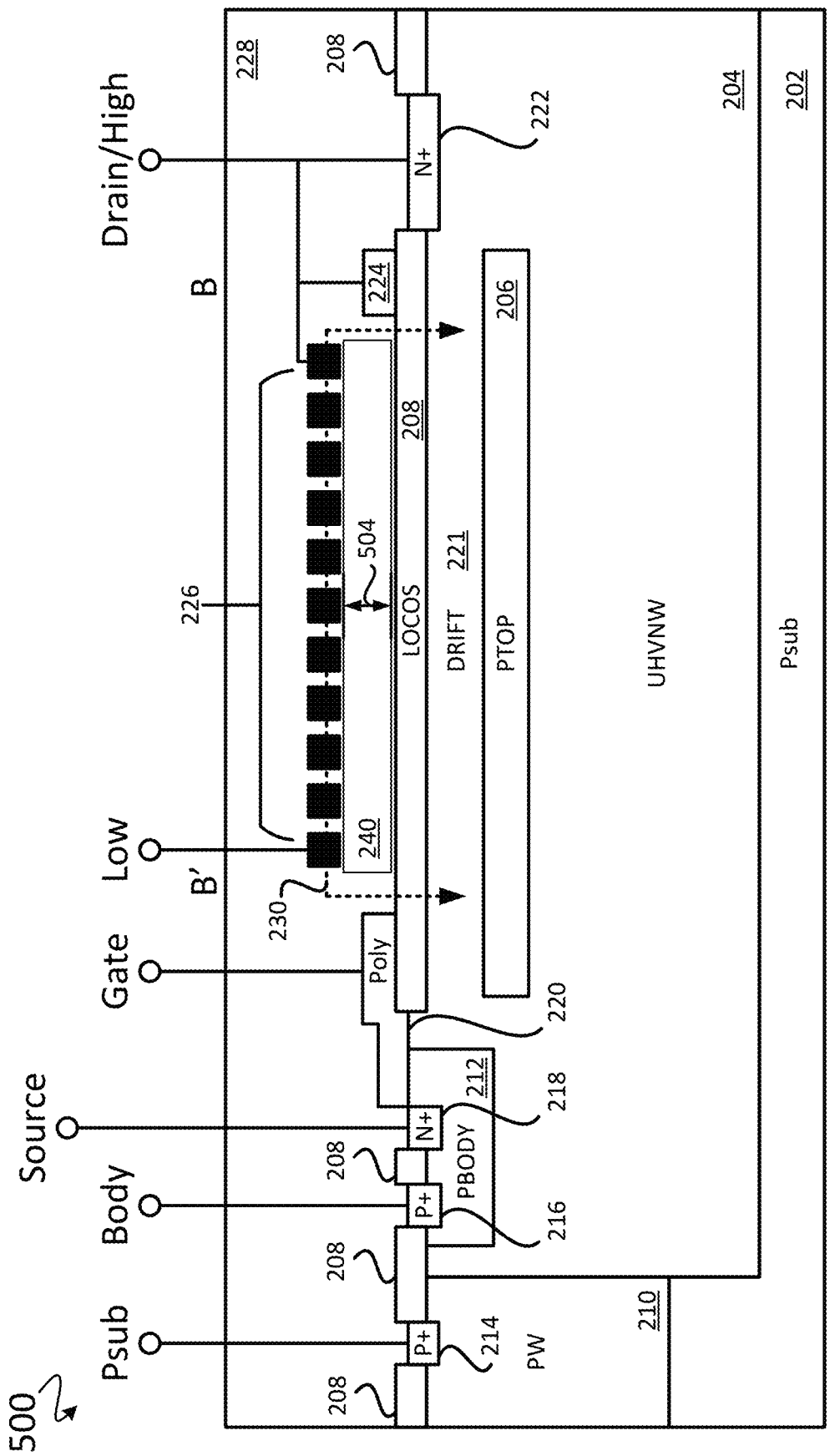

US 11,869,934 B2

1

ULTRA-HIGH VOLTAGE RESISTOR WITH VOLTAGE SENSE

RELATED APPLICATIONS

This application claims priority to U.S. Provisional Application No. 63/063,746, filed Aug. 10, 2020, all of which is incorporated by reference herein in its entirety for all purposes.

BACKGROUND

Modern electronic devices such as smartphones, laptops, tablets, netbooks, etc., generally require power supply components for providing and stabilizing a supply voltage applied to subsystems of the electronic devices. Such power supply components include, but are not limited to, switch-mode power supplies, such as forward converters, flyback converters, boost converters, and buck converters.

Typically, metal-oxide-semiconductor field-effect transistor (MOSFET) devices are used to implement power switches to control voltage conversion provided by the power supply components. In some applications, the power switches are high-voltage MOSFET devices, such as lateral diffusion field-effect transistors (LDFETs), which advantageously have a high breakdown voltage. In some applications, one or more thin or thick film resistors are formed over an active layer of the power switch. In some applications, such thin or thick film resistors are used as part of a circuit to determine a voltage developed across the power switch.

SUMMARY

In some embodiments, a semiconductor device includes an active region, a LOCOS region formed within the active region and extending vertically above a top surface of the active region, a gate region formed above the top surface of the active region, and a polysilicon resistor having a bottom surface that is offset vertically and physically isolated from a top surface of the LOCOS region. The active region includes a source region that is laterally disposed from the gate region, a drain region that is laterally disposed from the gate region, and a drift region that is laterally disposed between the gate region and the drain region. The polysilicon resistor is formed above the drift region. The active region further includes a first charge balance region formed in the active region below the drift region.

In some embodiments, a method involves providing an active region for forming a semiconductor device. A first charge balance region is formed within the active region. A drift region is formed within the active region and above the first charge balance region. A LOCOS region is formed within the active region and extends vertically above a top surface of the active region. A gate region is formed above the top surface of the active region. A source region is formed in the active region and is laterally disposed from the gate region and the drift region. A drain region is formed in the active region and is laterally disposed from the gate region and the drift region. A polysilicon resistor is formed above the LOCOS region and is substantially laterally aligned with the drift region. The polysilicon resistor has a bottom surface that is offset vertically and physically isolated from the top surface of the LOCOS region.

2

Figure 1A:
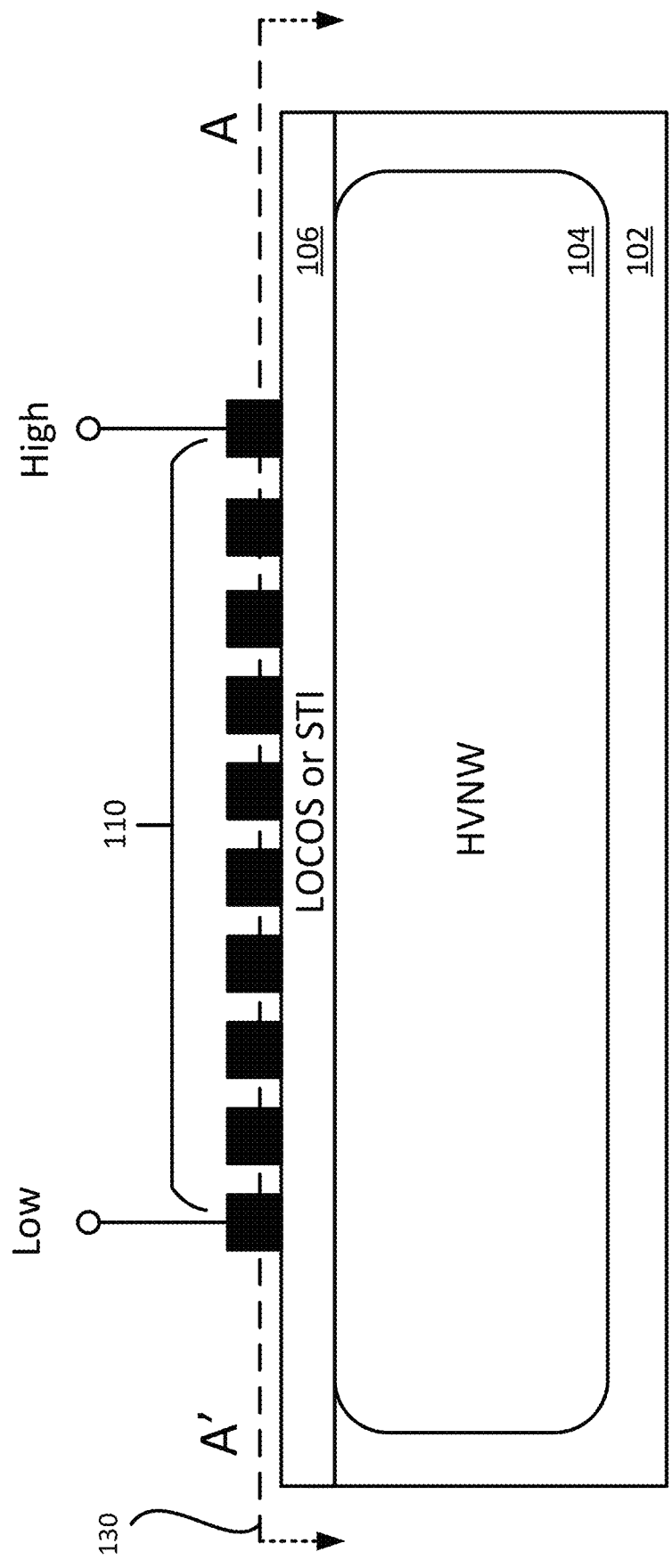
FIG. 1A is a simplified cross-section view of a prior-art semiconductor device with a conventional integrated resistor.
Figure 1B:
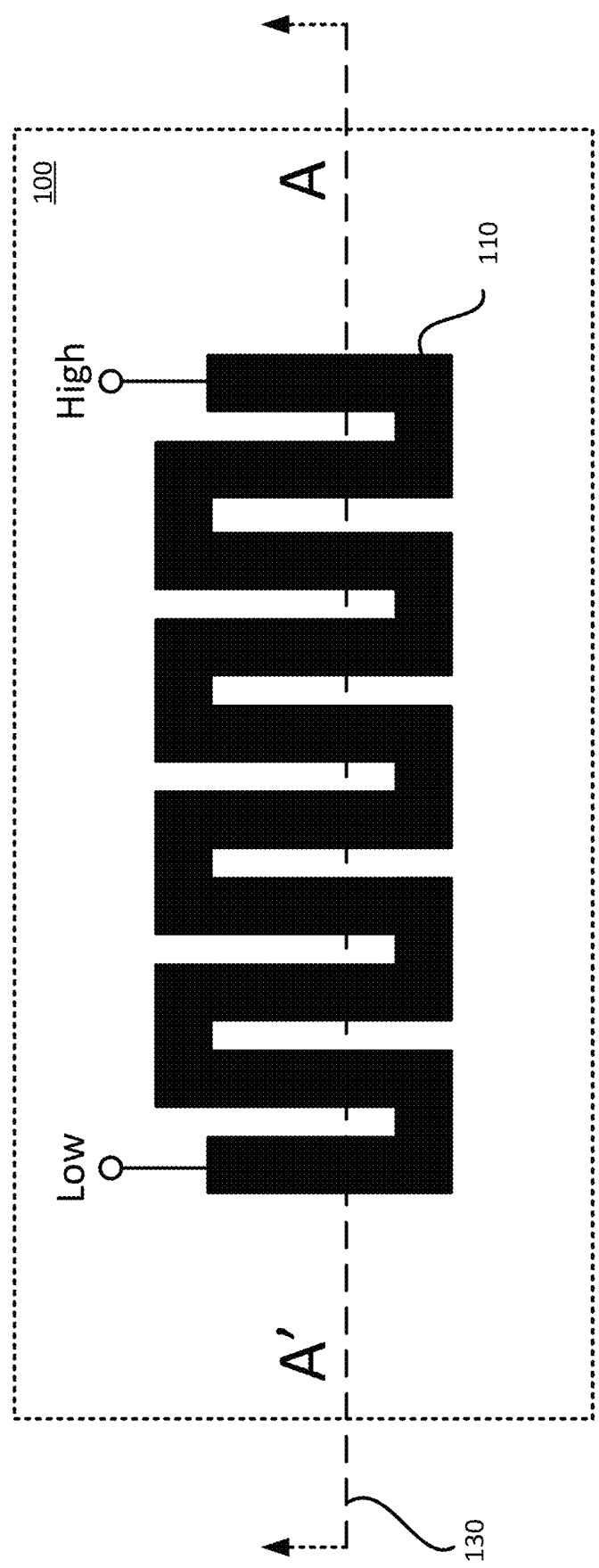

FIG. 1B is a simplified plan view of the prior-art semiconductor device shown in FIG. 1A.

Figure 2A:
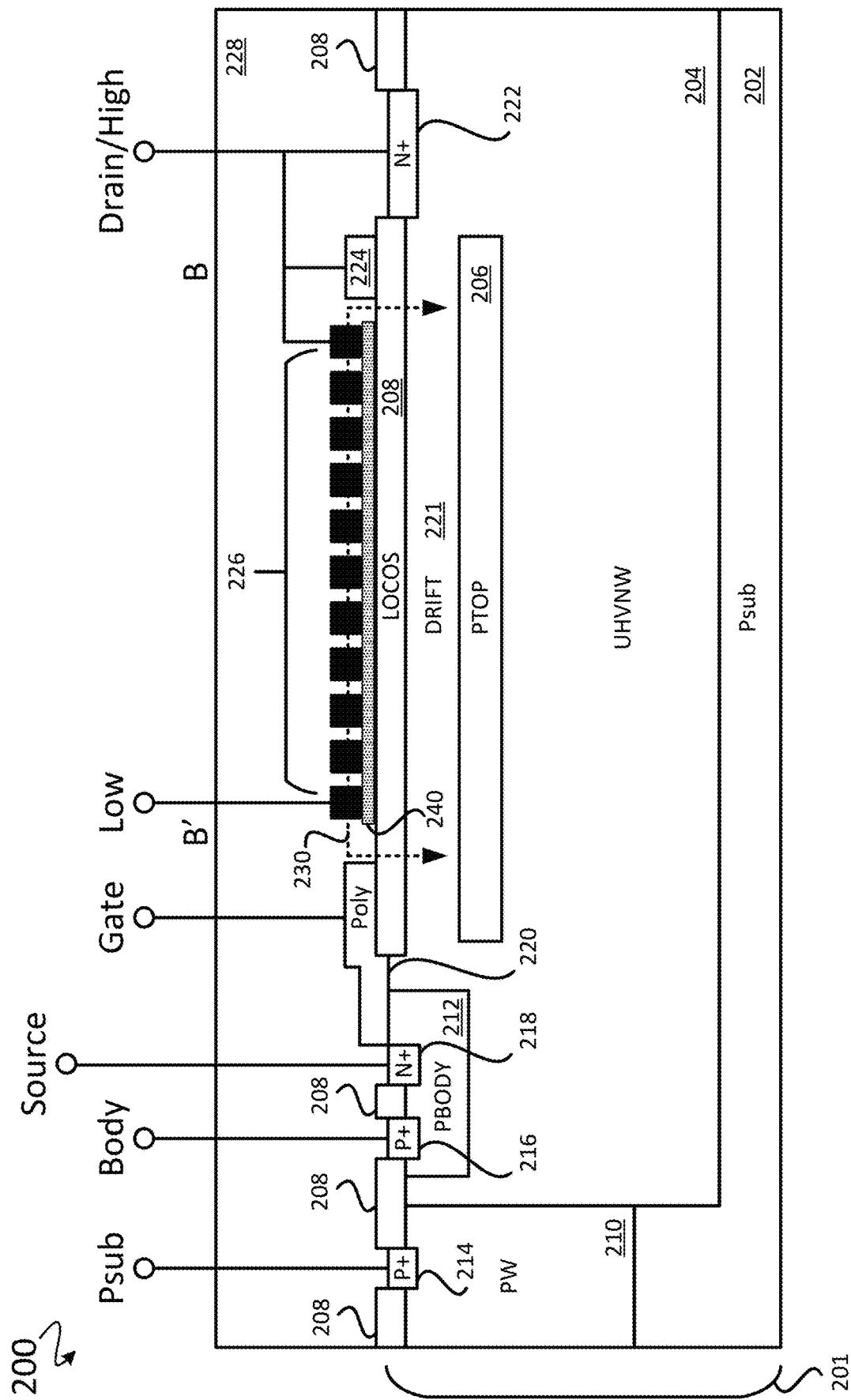

FIG. 2A is a first simplified cross-section view of a semiconductor device with an integrated ultra-high voltage resistor, in accordance with some embodiments.

Figure 2B:
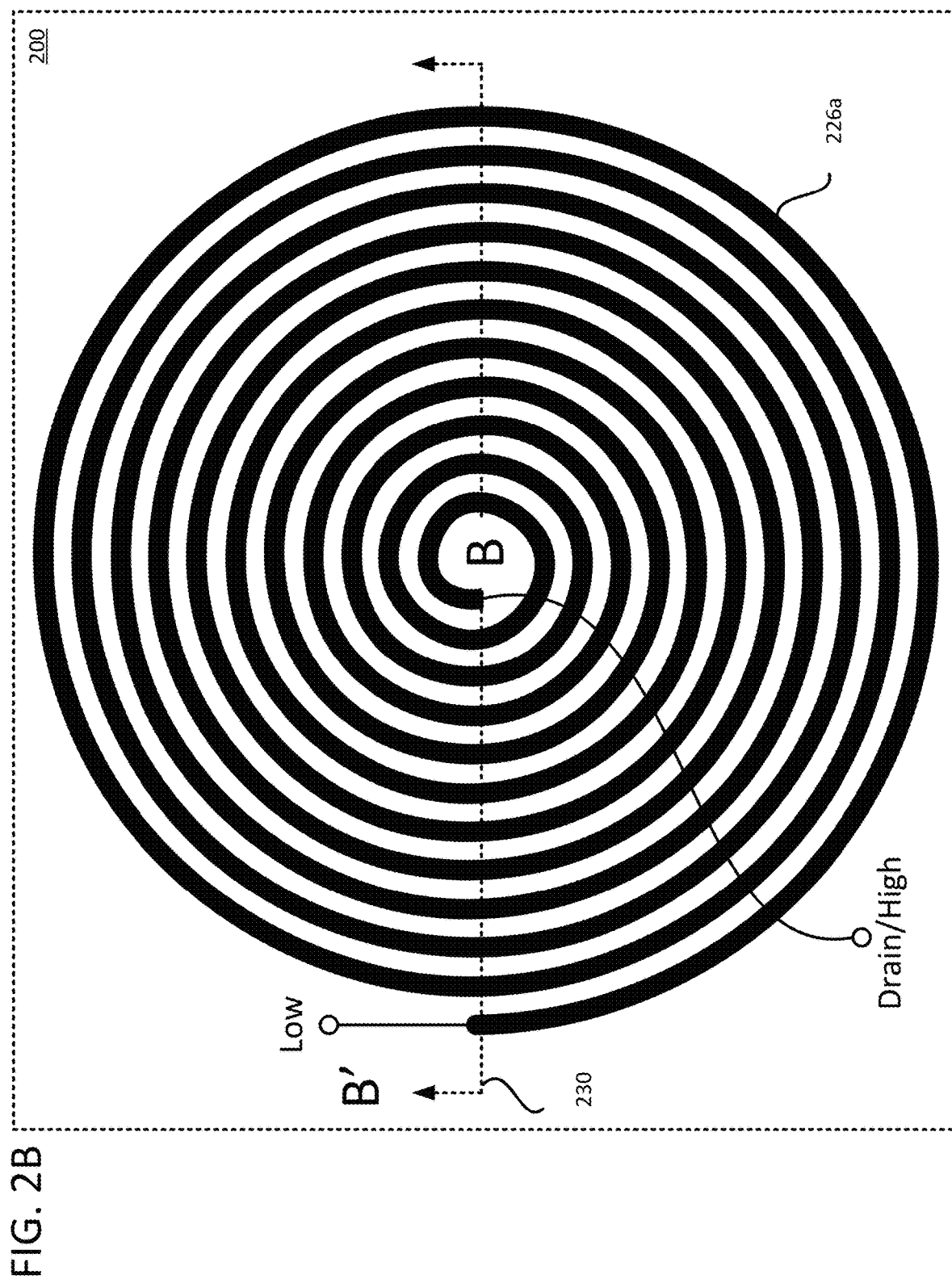

FIG. 2B is a first simplified example plan view of the semiconductor device with the ultra-high voltage resistor shown in FIG. 2A, in accordance with some embodiments.

Figure 2C:
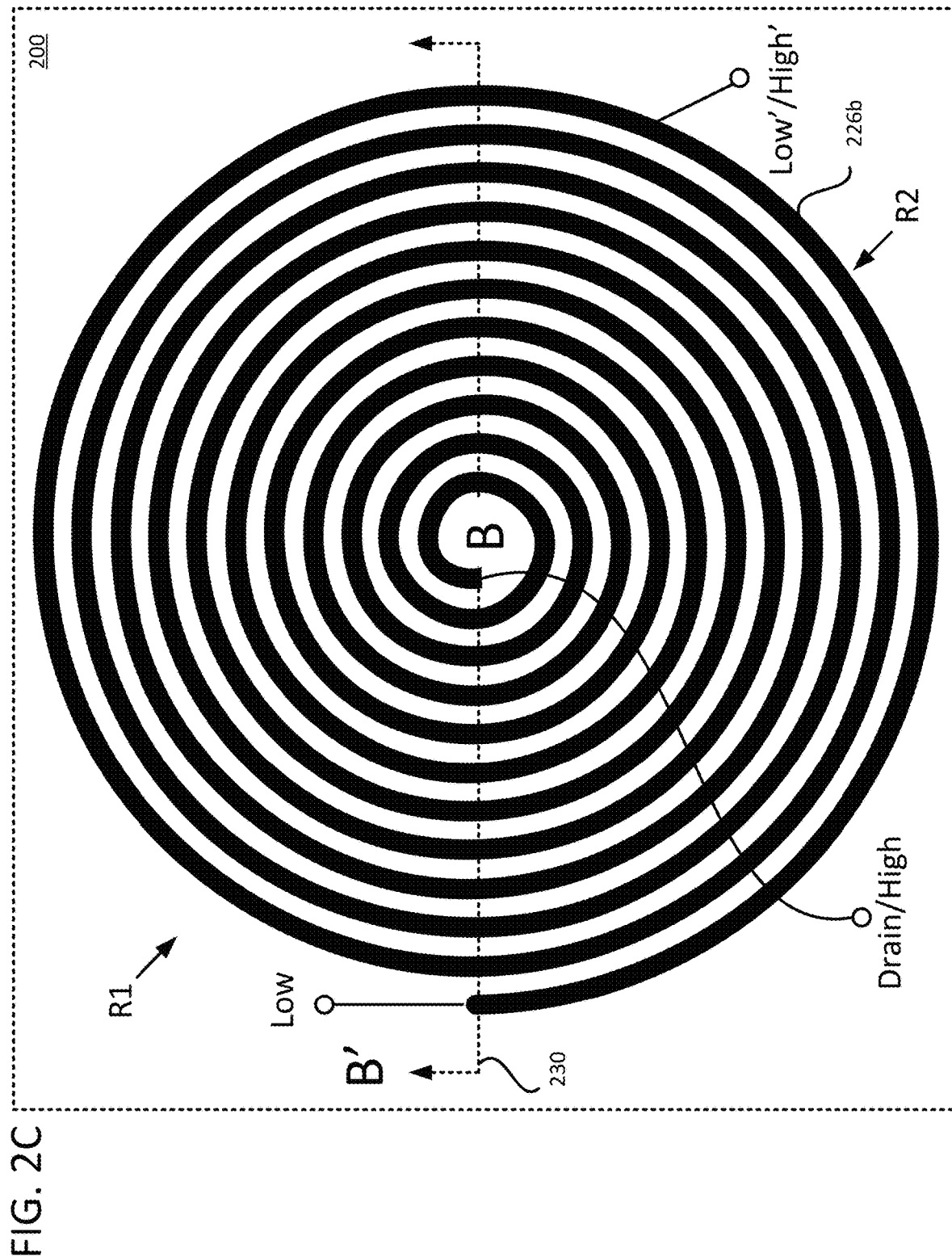

FIG. 2C is a second simplified example plan view of the semiconductor device with the ultra-high voltage resistor shown in FIG. 2A, in accordance with some embodiments.

Figure 3:
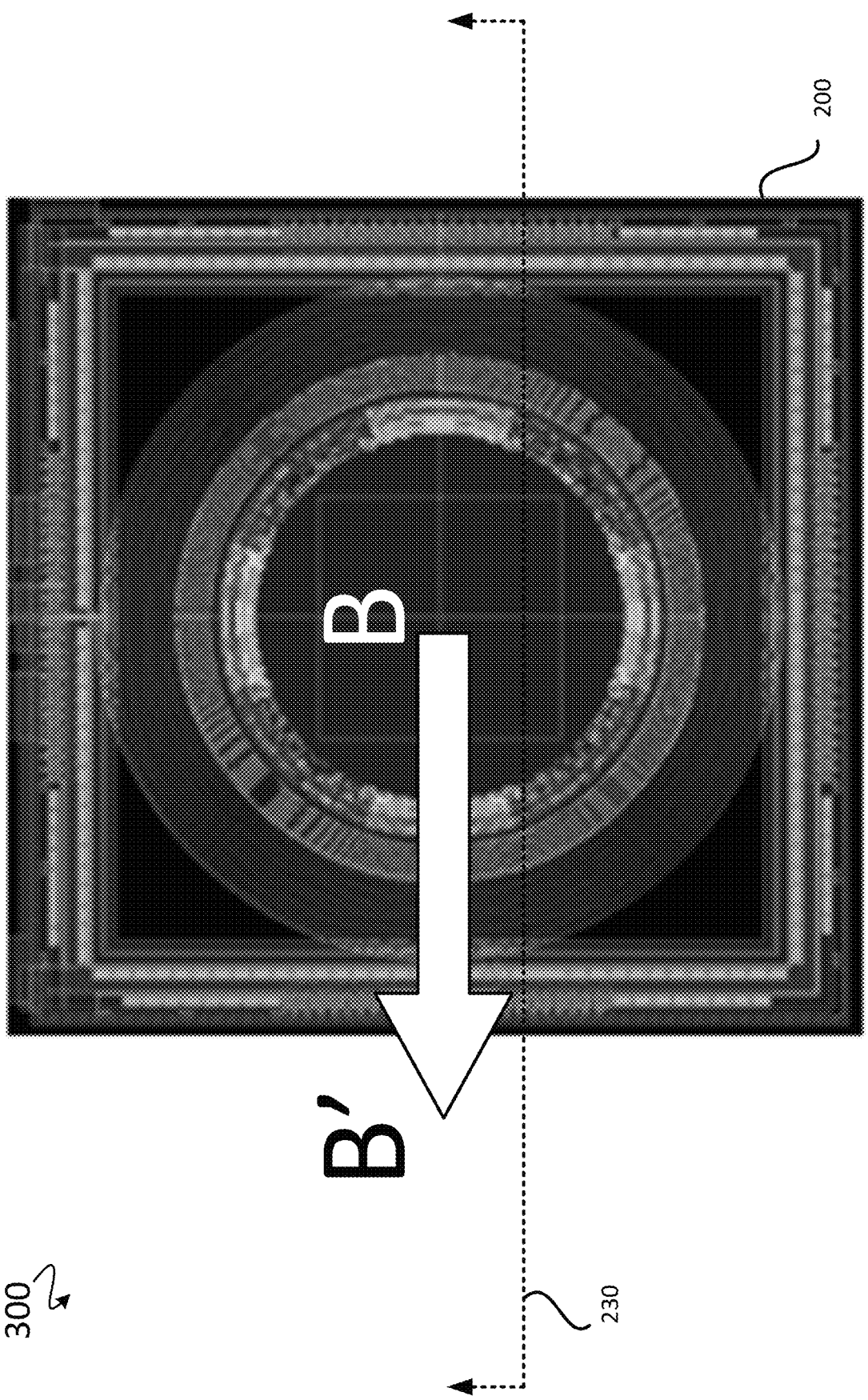

FIG. 3 is an image of a plan view of a realization of the semiconductor device shown in FIG. 2A and either of FIG. 2B or FIG. 2C, in accordance with some embodiments.

Figure 4:
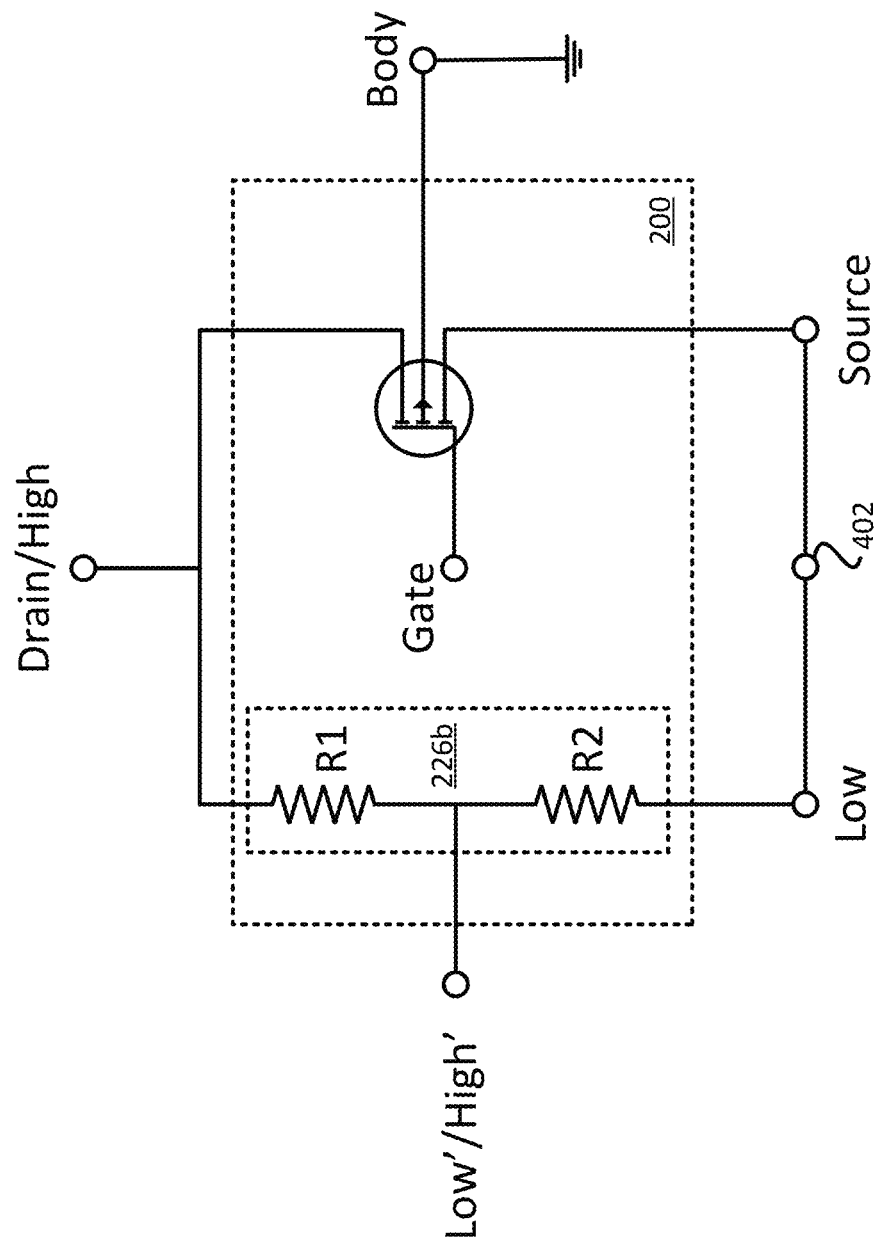

FIG. 4 is a simplified circuit schematic that includes the semiconductor device shown in FIG. 2A and FIG. 2C, in accordance with some embodiments.

FIG. 5A is a second simplified cross-section view of a semiconductor device with an integrated ultra-high voltage resistor, in accordance with some embodiments.

Figure 5B:
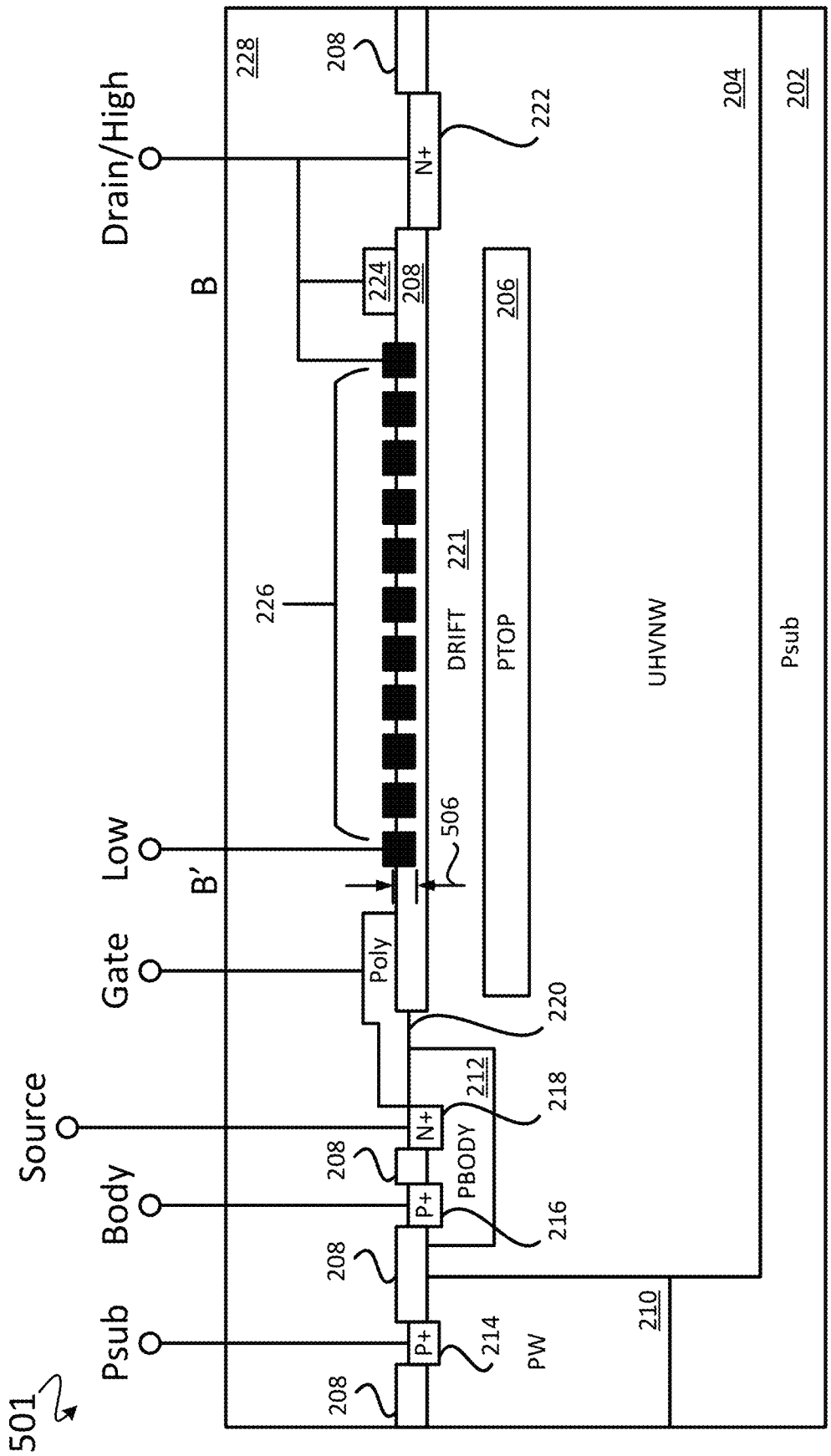

FIG. 5B is a third simplified cross-section view of a semiconductor device with an integrated ultra-high voltage resistor, in accordance with some embodiments.

Figure 6:
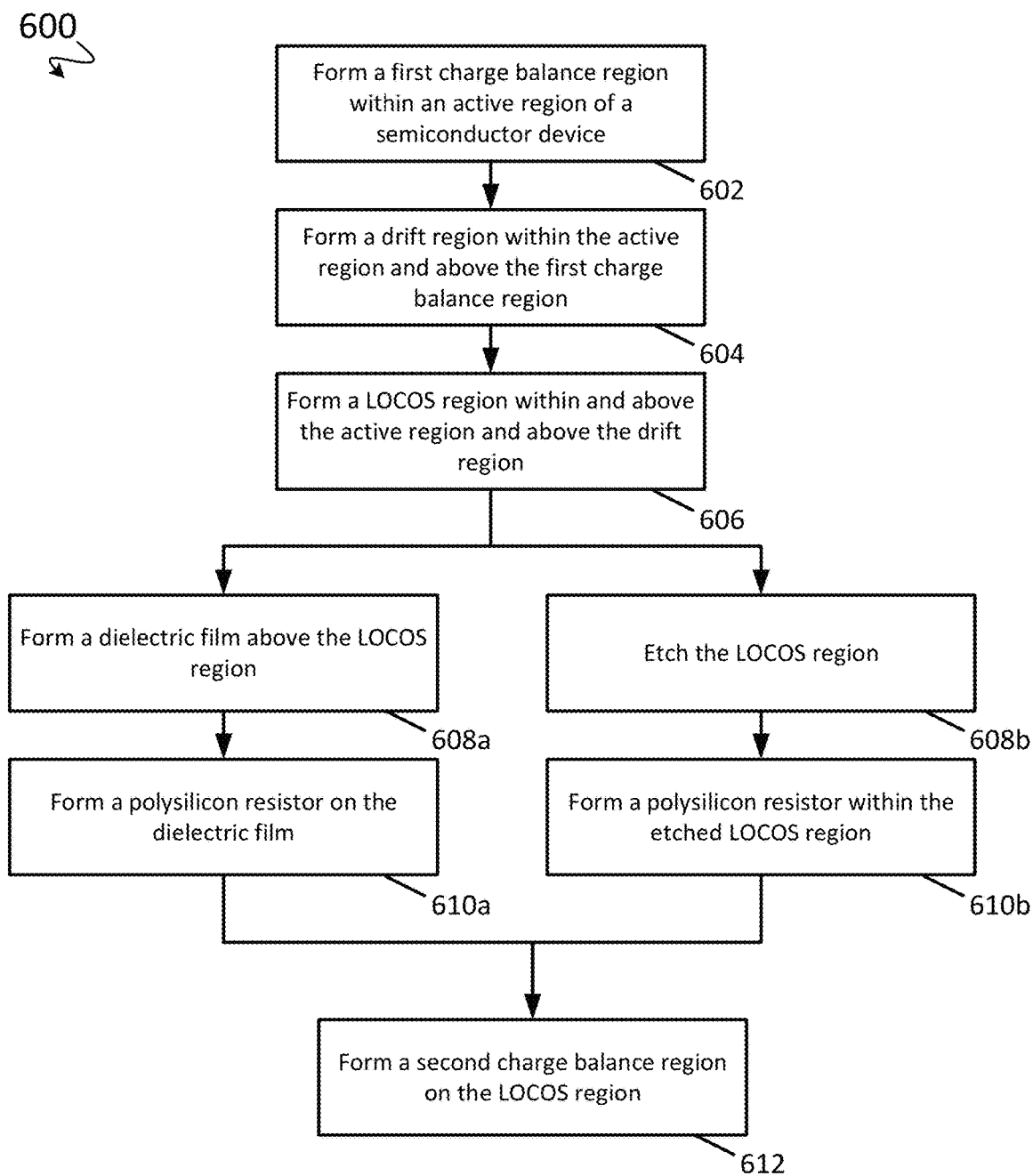

FIG. 6 shows a portion of a process for forming the semiconductor device shown in FIG. 5A or FIG. 5B, in accordance with some embodiments.

DETAILED DESCRIPTION

Metal-oxide-semiconductor field-effect transistor (MOSFET) devices may be used to implement high voltage power switches. Such high voltage power switches may be used to control a voltage conversion provided by power supply components. In some applications, the power switches are high-voltage MOSFET devices, such as lateral diffusion field-effect transistors (LDFETs), which advantageously have a high breakdown voltage.

In some applications, a resistor is used to sense a voltage developed across the power switch (e.g., from a drain node of the power switch to a source node of the power switch). Conventionally, such resistors are implemented using either a discrete resistor or by a resistor that is integrated (e.g., using a thin film process) with the power switch. Applications that use a discrete resistor may incur additional manufacturing costs to reserve PCB area for the discrete resistor. Additionally, solutions using a discrete resistor may suffer from mismatch with an external resistor if the discrete resistor is co-packaged with the power switch.

As disclosed herein, a spiral layout style of an ultra-high voltage (UHV) polysilicon resistor is integrated with an isolated UHV LDFET. As disclosed herein, the UHV polysilicon resistor advantageously produces a graded voltage drop across the UHV polysilicon resistor and above a drift region of the UHV LDFET. In some embodiments, the UHV polysilicon resistor is formed in a spiral pattern that is advantageously devoid of sharp angular transitions as compared to conventional serpentine patterns. Such sharp angular transitions of conventional serpentine patterns are typically points at which the electrical field may be concentrated, thereby increasing a likelihood of device breakdown. By comparison, the electrical field produced by the UHV polysilicon resistor disclosed herein is advantageously distributed across the length of the spiral pattern of the UHV polysilicon resistor without such points of concentrated electrical field. Additionally, a designer may advantageously implement a high resistance polysilicon resistor in series with, and of the same width as, the UHV polysilicon resistor to provide a voltage divider circuit that may be used to determine a voltage developed across the UHV LDFET. A vertical offset of a bottom surface of the UHV polysilicon resistor from a top surface of Local Oxidation of Silicon (LOCOS) regions (and/or Shallow Trench Isolation (STI) regions) is advantageously selectable independently of a thickness of the LOCOS regions (and/or Shallow Trench Isolation (STI) regions) by using either an intervening thin dielectric film (e.g., for a positive vertical offset) or an etch process in the LOCOS regions (and/or the STI regions), thereby enabling a designer to realize desired operational characteristics of the UHV LDFET such as a desired breakdown voltage and hot carrier injection effects independently of an optimal vertical width of the LOCOS regions.

Additionally, the graded electrical field produced by the UHV polysilicon resistor may advantageously reduce an RC time constant delay for switching the UHV LDFET, thereby improving system performance at high frequencies. Still additionally, the UHV polysilicon resistor may advantageously provide improved self-protected electrostatic discharge (ESD) performance of the UHV LDFET.

FIG. 1A is a simplified cross-section view of a prior-art semiconductor device ("device") 100 with an integrated resistor. The device 100 generally includes a wafer 102, a high-voltage n-type well (HVNW) 104, a LOCOS (Local Oxidation of Silicon) region or shallow trench isolation (STI) region 106, and a polysilicon resistor 110 formed directly on the LOCOS or STI region 106. Also shown is a cross-section indicator 130 and positional indicators A and A'. A high-voltage terminal of the polysilicon resistor 110 is labeled "High", and a low-voltage terminal of the polysilicon resistor 110 is labeled "Low".

FIG. 1B is a simplified plan view of a portion of the device 100 shown in FIG. 1A, corresponding to the cross-section indicator 130. As shown in FIG. 1B, the polysilicon resistor 110 is implemented in a conventional serpentine layout. As such, regions of concentrated electrical field may develop at sharp angular transitions of the serpentine layout, thereby increasing a likelihood of device breakdown due to concentrated electrical field penetrating into the active regions of the device 100.

FIG. 2A is a simplified cross-section view of an ultra-high voltage semiconductor (i.e., LDFET) device ("device") 200 that includes an ultra-high voltage (UHV) polysilicon resistor 226, in accordance with some embodiments. The device 200 generally includes an active region 201, a p-type conductivity substrate region 202, an ultra-high voltage n-type conductivity region well (UHVNW) 204, a first charge balance region 206 (e.g., a floating p-type conductivity PTOP region), LOCOS regions (and/or Shallow Trench Isolation regions) 208, a p-type conductivity well region 210, a p-type body region 212, a heavily doped p-type conductivity p-well contact region 214, a heavily-doped p-type p-body contact region 216, a heavily doped n-type conductivity source region 218, a polysilicon gate region 220, an n-type conductivity drift region 221, a heavily doped n-type conductivity drain region 222, a second charge balance region 224 (e.g., a polysilicon region), the ultra-high voltage (UHV) polysilicon resistor 226, a dielectric region 228, and a dielectric film 240. Also shown is a cross-section indicator 230 and positional indicators B and B'. A high-voltage terminal (i.e., a first terminal) of the polysilicon resistor 226 is labeled "Drain/High", and a low-voltage terminal (i.e., a second terminal) of the polysilicon resistor 226 is labeled "Low." The active region 201 of the device 200 includes the regions 204, 206, 210, 212, 214, 216, 218, 221, and 222. A top surface of the active region 201 is coincident with a top surface of the regions 212, 214, 216, 218, and 222. In the embodiment shown, a bottom surface of the polysilicon resistor 226 is coincident with a top surface of the dielectric film 240. The LOCOS regions 208 are formed within and above the active region 201.

In some embodiments, the low-voltage terminal of the polysilicon resistor 226 is conductively connected to an external terminal of a package of the device 200. In other embodiments, the low-voltage terminal of the polysilicon resistor 226 is connected to a node or terminal within a package of the device 200. Some elements of the device 200 have been omitted from FIG. 2A to simplify the foregoing description but are understood to be present.

In some embodiments, a lateral extent of the first charge balance region 206 is less than a lateral extent of the drift region 221. In such embodiments, a lateral extent of the polysilicon resistor 226 is less than the lateral extent of the charge balance region 206 and the drift region 221 such that the charge balance region 206 extends laterally past each end of the polysilicon resistor 226. Such embodiments of the lateral extent of the charge balance region 206 allow for a heavier doping in the drift region 221, which thereby advantageously reduces an on-resistance of the device 200. In some embodiments, the polysilicon resistor 226 is substantially laterally aligned (i.e., centered) with the first charge balance region 206 and the drift region 221. The first charge balance region 206 is laterally offset from, and non-contiguous with, the p-type conductivity well region 210 and the p-type body region 212 (i.e., the first charge balance region is floating).

In some embodiments, the polysilicon resistor 226 is formed in a spiral shape. In other embodiments, the polysilicon resistor 226 is formed in a helical shape (not shown). In yet other embodiments, the polysilicon resistor 226 is formed in an oval or "race-track" shape (not shown). In still yet other embodiments, the polysilicon resistor 226 is formed in a serpentine shape (not shown).

The first charge balancing region 206 and the second charge balance region 224, as well as other doping levels of the device 200, are configured to advantageously increase a breakdown voltage of the device 200. The polysilicon resistor 226 is operable to further balance electrical charge across the drift region 221 of the device 200. The polysilicon resistor 226 advantageously creates a voltage gradient above the portion of the LOCOS region 208 that is above the drift region 221, a maximum value of the voltage gradient occurring close to positional indicator B and a minimum value of the voltage gradient occurring close to the positional indicator B'. The voltage gradient in the polysilicon resistor 226, between the positional indicator B and the positional indicator B', substantially tracks a voltage gradient occurring in the drift region 221 between the positional indicator B and the positional indicator B'. Thus, for each point laterally between the positional indicator B and the positional indicator B', a voltage potential between the polysilicon resistor 226 and a corresponding point in the drift region 221 is advantageously reduced to about zero.

In some embodiments, the polysilicon resistor 226 is doped with a dopant that includes Boron or Phosphorus and is implanted at an energy level ranging from 5 keV to 100 keV and at a dopant concentration ranging from $1E14 \text{ B/cm}^3$ to $1E15 \text{ B/cm}^3$. The resultant resistance achieved between the terminal labeled Drain/High and the terminal labeled Low of the polysilicon resistor 226 ranges from 1MOhm to 60 MOhm. A breakdown voltage Vds of the device 200 advantageously ranges up to 1500 volts.

A first isolation region formed by the dielectric film 240 advantageously provides an adjustable (at manufacture time) vertical offset between a top surface of a second isolation region formed by the LOCOS region 208 (coincident with an upper bottom surface of the stepped polysilicon gate region 220) and a bottom surface of the polysilicon resistor 226. As described below with reference to FIG. 5A and FIG. 5B, operational characteristics of the device 200 may be advantageously adjusted based on the vertical offset of the polysilicon resistor 226. In some embodiments, the dielectric film 240 is part of the dielectric region 228. For example, in such embodiments, the dielectric film 240 may be formed by etching the dielectric region 228 such that a desired vertical thickness of the dielectric film 240 is realized. In other embodiments, the dielectric film 240 may be a different dielectric than the dielectric used in the dielectric region 228. In some embodiments, the dielectric film 240 may be deposited oxide, Silicon-rich oxide, nitride, Silicon-Rich nitride, oxynitride, or a combination of oxide and nitride films (e.g., ONO).

The polysilicon resistor 226 may be formed with either a positive vertical offset or with a negative vertical offset relative to the top surface of the LOCOS regions 208. In embodiments of the device 200 having a positive vertical offset, the bottom surface of the polysilicon resistor 226 is offset vertically above (but not on) the top surface of the LOCOS regions 208. In embodiments of the device 200 having a negative vertical offset, the bottom surface of the polysilicon resistor 226 is offset vertically below the top surface of the LOCOS regions 208. By implementing such positive or negative vertical offsets independently from a thickness of the LOCOS regions 208, a vertical position of the polysilicon resistor 226, and in some cases a thickness and/or type of dielectric of the dielectric film 240, may be selected to advantageously modulate an electric field of the device 200 to increase and stabilize a breakdown voltage of the device 200 as well as to shield the device 200 from any fixed and mobile charges on the wafer surface and beyond.

FIG. 2B is a first simplified example plan view of a portion of the device 200, corresponding to the cross-section indicator 230 shown in FIG. 2A, in accordance with some embodiments. As shown in FIG. 2B, a two-terminal polysilicon resistor 226a, which implements the polysilicon resistor 226 shown in FIG. 2A, has a continuous curve along a length from the Drain/High terminal to the Low terminal. Thus, concentrated electric field regions do not form along the length of the polysilicon resistor 226a, advantageously decreasing the likelihood of a breakdown of the device 200 from occurring.

FIG. 2C is a second simplified example plan view of a portion of the device 200, corresponding to the cross-section indicator 230 shown in FIG. 2A, in accordance with some embodiments. As shown in FIG. 2C, a three-terminal polysilicon resistor 226b, which implements the polysilicon resistor 226 shown in FIG. 2A, has a continuous curve along a length from the Drain/High terminal to the Low terminal. Thus, concentrated electric field regions do not form along the length of the polysilicon resistor 226b, advantageously decreasing the likelihood of a breakdown of the device 200 from occurring. The polysilicon resistor 226b includes a third terminal, labeled Low'/High', in conductive contact with the polysilicon resistor 226b at a point between the Drain/High terminal and the Low terminal. The third terminal Low'/High' is configured to form a voltage divider circuit for voltage sensing that includes a series circuit combination of a high-side resistor R1 between the Drain/High terminal and the Low'/High' terminal (i.e., a first portion of the polysilicon resistor 226b), and a low-side resistor R2 between the Low'/High' terminal and the Low terminal (i.e., a second portion of the polysilicon resistor 226b). The resistor divider circuit R1, R2 may be configured such that the high-side resistor R1 is of a substantially higher resistance (e.g., mega-ohms) than that of the low-side resistor R2 (e.g., kilo-ohms). Thus, a voltage measured at the Low'/High' terminal will advantageously be at a voltage level that can be measured using conventional low to medium voltage level measurement circuitry rather than high voltage level measurement circuitry. Additionally, because both the high-side resistor R1 and the low-side resistor R2 are formed using the same polysilicon resistor 226b, a ratio of resistance values between R1, R2 will be less sensitive to process variation as compared to conventional devices.

FIG. 3 is an image 300 of a plan view corresponding to the cross-section indicator 230 shown in FIG. 2A of a realization of a portion of the device 200 and either of FIG. 2B or FIG. 2C, in accordance with some embodiments.

FIG. 4 is a simplified circuit schematic 400 that includes the device 200 shown in FIG. 2A when implemented with the polysilicon resistor 226b as shown in FIG. 2C, in accordance with some embodiments. As shown, when the Low terminal of the polysilicon resistor 226b and the source node of the device 200 (i.e., the heavily doped n-type conductivity source region 218) are tied to a common node 402, the resistors R1, R2 of the polysilicon resistor 226b are operable to form a resistor divider circuit that may be used to measure a drain-source voltage of the device 200 (i.e., at the Low'/High' node).

As mentioned above with respect to FIG. 2A, adjustments made to a vertical offset of the polysilicon resistor 226 advantageously enable desired operational characteristics of the device 200 to be achieved. As shown in FIG. 5A, in some embodiments, a vertical offset 504 of a bottom surface of the polysilicon resistor 226 with respect to a top surface of the LOCOS region 208 is positive. A device 500 shown in FIG. 5A includes all of the regions of the device 200 described with respect to FIG. 2A, the description of which is not repeated here. The positive vertical offset 504 of the polysilicon resistor 226 is achieved by a vertical thickness of the dielectric film 240 that is formed (e.g., from deposition or etching) on the LOCOS regions 208 before the polysilicon resistor 226 is formed. In some embodiments, the positive vertical offset 504 is greater than 0 and is less than about 700 nm. Because the positive vertical offset 504 is greater than 0 (i.e., the polysilicon resistor 226 is not formed directly on the LOCOS regions 208), operational characteristics of the device 200 may be advantageously selected as a function of the positive vertical offset 504. Thus, a vertical thickness of the LOCOS regions 208 may be independently optimized.

A field modulation effect of the device 500 may be adjusted by changing the positive vertical offset 504. Increasing the positive vertical offset 504 (e.g., by increasing a thickness of the dielectric film 240) reduces a field modulation effect of the device 500, but also reduces a hot carrier injection effect of the device 500. Additionally, the type of dielectric used for the dielectric film 240 may be selected to reduce a sensitivity of the device 500 to the hot carrier injection effect which results in a better (e.g., higher) breakdown voltage of the device 500 and increase overall reliability of the device 500.

As shown in FIG. 5B, in some embodiments, a vertical offset 506 of a bottom surface of the polysilicon resistor 226 with respect to a top surface of the LOCOS region 208 is negative. A device 501 shown in FIG. 5B includes most of the regions of the device 200 described with respect to FIG.

2A, the description of which is not repeated here. However, because the vertical offset 506 is negative, the dielectric film 240 may be omitted. The negative vertical offset 506 of the polysilicon resistor 226 is achieved by forming the polysilicon resistor 226 within an etched dielectric region of the LOCOS regions 208 (e.g., by etching the LOCOS regions 208 and then depositing the polysilicon resistor 226 within the etched LOCOS regions 208). In some embodiments, negative vertical offset ranges from less than zero to about -250 nm. The thinner the field oxide of the LOCOS regions 208, and thereby the more negative the negative vertical offset 506, the stronger the field modulation effect of the device 501. However, the negative vertical offset 506 may be limited by a vertical voltage potential difference between the polysilicon resistor 226 and the drift region 221. This limitation is because the vertical voltage potential drop can cause hot carrier injection into the LOCOS regions 208, which may lead to a breakdown voltage shift and degradation of the device 501. In general, the thinner the LOCOS regions 208 due to the negative vertical offset 506, the stronger the hot carrier injection effect in the device 501.

In some embodiments (not shown), the vertical offset 504/506 of the polysilicon resistor 226 changes along a length of the polysilicon resistor 226. For example, in some embodiments, the positive vertical offset 504 increases from near zero to a value greater than zero along a length of the polysilicon resistor 226. In other embodiments, the negative vertical offset 506 decreases from near zero to a value less than zero along a length of the polysilicon resistor 226. In yet other embodiments, a vertical offset of the polysilicon resistor 226 increases from a value less than zero (i.e., formed within an etched region of the LOCOS regions 208) to a value greater than zero (i.e., formed on top of the dielectric film 240) along a length of the polysilicon resistor 226. In some embodiments, the vertical offset of the polysilicon resistor 226 decreases along its length from a positive vertical offset at a location close to the positional indicator B', to a less positive, or negative, vertical offset close to the positional indicator B. In other embodiments, the vertical offset of the polysilicon resistor 226 decreases along its length from a positive vertical offset at a location close to the positional indicator B, to a less positive, or negative, vertical offset close to the positional indicator B'.

FIG. 6 shows a portion of a process 600 for forming the device 500 shown in FIG. 5A or the device 501 shown in FIG. 5B, in accordance with some embodiments. The particular steps, order of steps, and combination of steps are shown for illustrative and explanatory purposes only. Other embodiments can implement different particular steps, orders of steps, and combinations of steps to achieve similar functions or results. The steps of the process 600 are described with reference to FIG. 5A and to FIG. 5B.

At step 602, a first charge balance region (206) is formed in an active region (201) of a semiconductor device (500/501). At step 604, a drift region (221) is formed in the active region (201) above the first charge balance region (206). At step 606, LOCOS regions (or an STI region) (208) are formed within and above the active region (201) and above the drift region (221). In embodiments in which a bottom surface of the polysilicon resistor (226) is offset vertically above a top surface of the LOCOS regions (208), a dielectric film (240) is formed above (or on) the LOCOS region (208) at step 608a, and the polysilicon resistor (226) is formed on the dielectric film (240) at step 610a. In embodiments in which a bottom surface of the polysilicon resistor (226) is offset vertically below a top surface of the LOCOS regions (208), the LOCOS region (208) is etched at step 608b, and the polysilicon resistor (226) is formed within the etched regions of the LOCOS region (208) at step 610b. For either embodiment, a second charge balance region (224) is formed on the LOCOS regions (208) at step 612.

In embodiments in which the vertical offset 504/506 of the polysilicon resistor 226 changes along a length of the polysilicon resistor 226, both of steps 608a and 608b, as well as both of steps 610a and 610b, may be carried out as part of the process 600.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A semiconductor device, comprising:
    an active region;
    a LOCOS region formed within the active region and extending vertically above a top surface of the active region;
    a gate region formed above the top surface of the active region;
    a polysilicon resistor having a bottom surface that is offset vertically and physically isolated from a top surface of the LOCOS region;
    a first terminal of the polysilicon resistor that is configured to be electrically connected to a drain region; and
    a second terminal of the polysilicon resistor that is configured to be electrically connected to a source region;
    wherein:
    the active region comprises the source region laterally disposed from the gate region, the drain region laterally disposed from the gate region, and a drift region laterally disposed between the gate region and the drain region, the polysilicon resistor being formed above the drift region, the active region further comprising a first charge balance region formed in the active region below the drift region and the first charge balance region is separated from the LOCOS region by the drift region.

2. The semiconductor device of claim 1, further comprising:
    a body region formed in the active region; and
    a well region of a same conductivity type as the body region formed in the active region;
    wherein the first charge balance region is laterally offset from, and non-contiguous with, the body region and the well region.

3. The semiconductor device of claim 1, further comprising:
a dielectric film formed on the top surface of the LOCOS region, the polysilicon resistor being formed on a top surface of the dielectric film.

4. The semiconductor device of claim 3, wherein:
the dielectric film forms a first isolation region below the polysilicon resistor; and
the LOCOS region forms a second isolation region below the polysilicon resistor.

5. The semiconductor device of claim 1, further comprising:
an etched dielectric region formed through the top surface of the LOCOS region, the polysilicon resistor being formed in the etched dielectric region.

6. The semiconductor device of claim 1, further wherein:
a vertical offset of the bottom surface of the polysilicon resistor from the top surface of the LOCOS region changes along a length of the polysilicon resistor.

7. The semiconductor device of claim 1, wherein:
the polysilicon resistor is doped using a dopant comprising one of Boron or Phosphorus, the dopant being implanted at an energy level ranging from 5 kEV to 100 keV and at a dopant concentration ranging from $1E14$ B/cm$^3$ to $1E15$ B/cm$^3$.

8. The semiconductor device of claim 1, further comprising:
a third terminal of the polysilicon resistor;
wherein:
a series circuit combination of a first portion of the polysilicon resistor and a second portion of the polysilicon resistor form a resistor divider circuit;
the first portion of the polysilicon resistor is between the first terminal and the third terminal; and
the second portion of the polysilicon resistor is between the third terminal and the second terminal.

9. The semiconductor device of claim 8, wherein:
the first portion of the polysilicon resistor is of a substantially higher resistance than the second portion of the polysilicon resistor.

10. The semiconductor device of claim 1, wherein:
the polysilicon resistor is spiral-shaped in a plan view of the semiconductor device.

11. A semiconductor device, comprising:
an active region;
a LOCOS region formed within the active region and extending vertically above a top surface of the active region;
a gate region formed above the top surface of the active region; and
a polysilicon resistor having a bottom surface that is offset vertically and physically isolated from a top surface of the LOCOS region;
wherein:
the active region comprises a source region laterally disposed from the gate region, a drain region laterally disposed from the gate region, and a drift region laterally disposed between the gate region and the drain region, the polysilicon resistor being formed above the drift region, the active region further comprising a first charge balance region formed in the active region below the drift region and the first charge balance region is separated from the LOCOS region by the drift region;
a lateral extent of the first charge balance region is less than a lateral extent of the drift region;
a lateral extent of the polysilicon resistor is less than the lateral extent of the first charge balance region; and
the polysilicon resistor is substantially laterally aligned with the first charge balance region and the drift region.

12. A semiconductor device, comprising:
an active region;
a LOCOS region formed within the active region and extending vertically above a top surface of the active region;
a gate region formed above the top surface of the active region;
a polysilicon resistor having a bottom surface that is offset vertically and physically isolated from a top surface of the LOCOS region; and
a second charge balance region formed on the top surface of the LOCOS region and being configured to be electrically connected to a drain region;
wherein:
the active region comprises a source region laterally disposed from the gate region, the drain region laterally disposed from the gate region, and a drift region laterally disposed between the gate region and the drain region, the polysilicon resistor being formed above the drift region, the active region further comprising a first charge balance region formed in the active region below the drift region and the first charge balance region is separated from the LOCOS region by the drift region.

* * * * *